(12) United States Patent
Wang

(10) Patent No.: US 8,422,969 B2
(45) Date of Patent: Apr. 16, 2013

(54) RADIO FREQUENCY TRANSCEIVER

(75) Inventor: Chung Jui Wang, Hsinchu (TW)

(73) Assignee: Microelectronics Technology Inc., Hsinchu (TW)

( * ) Notice: Subject to any disclaimer, the term of this patent is extended or adjusted under 35 U.S.C. 154(b) by 356 days.

(21) Appl. No.: 12/860,606

(22) Filed: Aug. 20, 2010

(65) Prior Publication Data

US 2012/0045997 A1 Feb. 23, 2012

(51) Int. Cl.
*H01Q 11/12* (2006.01)
*H04B 1/04* (2006.01)

(52) U.S. Cl.
USPC ............... 455/127.2; 455/115.1; 455/114.3

(58) Field of Classification Search ............... 455/115.1, 455/127.1–127.5, 114.2, 114.3, 126
See application file for complete search history.

(56) References Cited

U.S. PATENT DOCUMENTS

| | | | | |
|---|---|---|---|---|
| 4,437,771 A * | 3/1984 | Cazzaniga | ............... | 374/39 |
| 4,485,349 A * | 11/1984 | Siegel et al. | ............... | 330/3 |
| 4,523,155 A * | 6/1985 | Walczak et al. | ............... | 330/279 |
| 4,701,717 A * | 10/1987 | Radermacher et al. | ....... | 330/149 |
| 4,882,767 A * | 11/1989 | Machida et al. | ............... | 455/117 |
| 5,177,453 A * | 1/1993 | Russell et al. | ............... | 330/284 |
| 5,530,920 A * | 6/1996 | Takeda | ............... | 455/102 |
| 5,659,253 A * | 8/1997 | Busking | ............... | 324/648 |
| 5,809,420 A * | 9/1998 | Ichiyanagi et al. | ............... | 455/103 |
| 5,873,029 A * | 2/1999 | Grondahl et al. | ............. | 455/126 |
| 6,359,498 B1 * | 3/2002 | Kurihara et al. | ............... | 327/513 |
| 6,430,403 B1 * | 8/2002 | Kossor | ............... | 455/126 |
| 6,472,949 B1 * | 10/2002 | Yamazaki et al. | ........... | 333/81 R |
| 6,677,823 B2 * | 1/2004 | Terosky et al. | ............... | 330/289 |
| 6,868,279 B2 * | 3/2005 | Sahlman et al. | ............. | 455/522 |
| 6,941,122 B2 * | 9/2005 | Shim | ............... | 455/232.1 |
| 7,068,985 B2 * | 6/2006 | Quilisch et al. | ............. | 455/127.2 |
| 7,127,219 B2 * | 10/2006 | Nitta | ............... | 455/126 |
| 7,257,381 B2 * | 8/2007 | Ammar | ............... | 455/73 |
| 7,362,196 B2 * | 4/2008 | Yan et al. | ............... | 333/81 R |
| 7,375,588 B2 * | 5/2008 | Yamakawa et al. | ........... | 330/289 |
| 7,545,209 B2 * | 6/2009 | Hughes | ............... | 330/86 |
| 7,706,762 B2 * | 4/2010 | Kirisawa | ............... | 455/127.2 |
| 7,728,647 B2 * | 6/2010 | DiTommaso | ............... | 327/513 |
| 8,145,152 B2 * | 3/2012 | Takahashi et al. | ......... | 455/115.1 |
| 2002/0025788 A1 * | 2/2002 | Nitta | ............... | 455/115 |
| 2003/0040290 A1 * | 2/2003 | Sahlman et al. | ............. | 455/115 |
| 2004/0198252 A1 * | 10/2004 | Rheem | ............... | 455/91 |
| 2008/0272865 A1 * | 11/2008 | Chen et al. | ............... | 333/81 R |
| 2009/0291651 A1 * | 11/2009 | Takahashi et al. | ......... | 455/115.1 |
| 2011/0151808 A1 * | 6/2011 | Agarwal | ............... | 455/114.2 |
| 2011/0187461 A1 * | 8/2011 | Mochizuki | ............... | 330/310 |

* cited by examiner

*Primary Examiner* — Edward Urban
*Assistant Examiner* — Rui Hu
(74) *Attorney, Agent, or Firm* — WPAT, P.C.; Anthony King

(57) ABSTRACT

A radio frequency transceiver includes a mixer circuit configured to convert an intermediate frequency signal into a radio frequency signal, a driver amplifier circuit configured to amplify the radio frequency signal from the mixer circuit, a temperature sensing circuit configured for sensing ambient temperature, and an attenuation circuit connected with the temperature sensing circuit, configured to decreasingly attenuate the radio frequency signal from the driver amplifier circuit as the ambient temperature increases.

8 Claims, 2 Drawing Sheets

RADIO FREQUENCY TRANSCEIVER

BACKGROUND OF THE INVENTION

1. Field of the Invention

The present invention relates to a radio frequency transceiver, and relates more particularly to a radio frequency transceiver exhibiting a gain that is unaffected by changes in ambient temperature.

2. Description of the Related Art

A satellite transceiver is capable of transmitting and receiving signals by utilizing a satellite communication system. Downlinked satellite signals collected by a parabolic dish are amplified, filtered and converted to signals in a lower frequency range by the satellite transceiver, and signals that are going to be transmitted to satellites are converted to radio frequency signals from intermediate frequency signals, and then filtered and amplified by a power amplifier circuit, and finally coupled to the parabolic dish.

Usually, the parabolic dish is installed at an outdoor site, and the transceiver is disposed close to the parabolic dish. With changes in weather or changes of seasons, the ambient temperature around the transceiver may fluctuate over a wide range. Such widely fluctuating temperatures may adversely affect the signal transmission of the transceiver. For example, the radio frequency signal gain at the output of the power amplifier circuit may decrease as the ambient temperature around the transceiver increases. Thus, the quality of signals transmitted to a satellite cannot be ensured.

SUMMARY OF THE INVENTION

One aspect of the present invention is to provide a radio frequency transceiver exhibiting a gain that is unaffected by changes in ambient temperature.

Another aspect of the present invention is to provide a radio frequency transceiver, the gain level of which can be adjusted.

To fulfill the above aspects, one embodiment of the present invention discloses a radio frequency transceiver, which includes a mixer circuit configured to convert an intermediate frequency signal into a radio frequency signal, a driver amplifier circuit configured to amplify the radio frequency signal from the mixer circuit, a temperature sensing circuit configured for sensing ambient temperature, and an attenuation circuit connected with the temperature sensing circuit, configured to decreasingly attenuate the radio frequency signal from the driver amplifier circuit as the ambient temperature increases.

Another embodiment of the present invention discloses a radio frequency transceiver, which includes a mixer circuit configured to convert an intermediate frequency signal into a radio frequency signal; a driver amplifier circuit configured to amplify the radio frequency signal from the mixer circuit; an attenuation circuit configured to provide variable attenuation for the level of a radio frequency signal from the driver amplifier circuit; a power amplifier circuit configured to amplify a radio frequency signal from the attenuation circuit, and a temperature sensing circuit configured to provide the attenuation circuit with an attenuation control signal varying with changes in ambient temperature such that the level of a radio frequency signal from the power amplifier circuit is held substantially constant during changes in the ambient temperature.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 1:
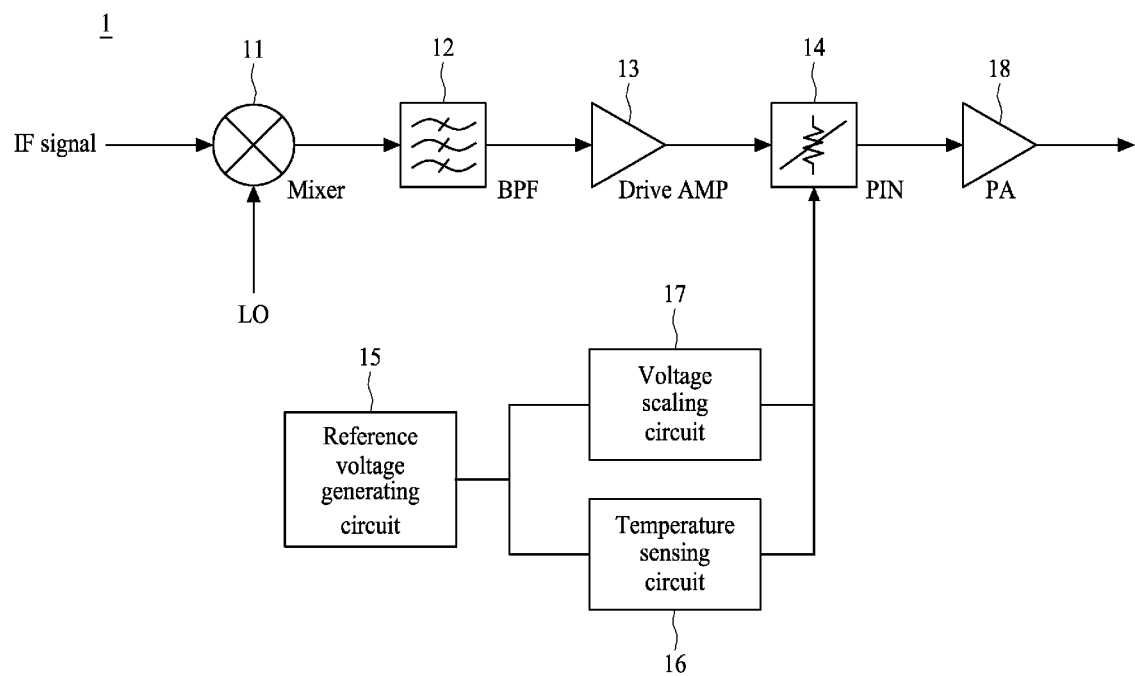
FIG. 1 is a block diagram of a radio frequency transceiver in accordance with one embodiment of the present invention.

FIG. 1 is a block diagram of a radio frequency transceiver 1 in accordance with one embodiment of the present invention. Referring to FIG. 1, the transceiver 1 comprises a mixer circuit 11, a band pass filter (BPF) circuit 12, a driver amplifier circuit 13, an attenuation circuit 14, a reference voltage generating circuit 15, a temperature sensing circuit 16, a voltage scaling circuit 17, and a power amplifier circuit 18.

A transmitting intermediate frequency (IF) signal is applied to a mixer circuit 11, mixed with a local oscillation signal LO from a local oscillation circuit (not shown), and frequency-converted to a radio frequency signal provided to the BPF circuit 12. The BPF circuit 12 filters out unwanted frequencies from the radio frequency signal. The driver amplifier circuit 13 amplifies the filtered radio frequency to output a desired voltage level of the radio frequency signal. The attenuation circuit 14, the attenuation level of which is controlled by a variable attenuation control signal generated by the temperature sensing circuit 16 configured for sensing the ambient temperature around the radio frequency transceiver 1, is configured to provide attenuation, decreasing with the increase of the ambient temperature, for the signal level of the amplified radio frequency signal, which also decreases as ambient temperature increases. The attenuation circuit 14 is configured to provide variable attenuation in such a manner that the signal level of the radio frequency signal from the driver amplifier circuit 13 can be held constant during changes in ambient temperature. In one embodiment, using the attenuation circuit 14 controlled by the temperature sensing circuit 16, the variation of the gain of the radio frequency transceiver 1 can be controlled within a range of 2 dB in response to the variations of ambient temperature. The power amplifier circuit 18 amplifies the attenuated radio frequency signal from the attenuation circuit 14 to a desired output level, and the amplified attenuated radio frequency signal may, for example, be provided to an isolator (not shown) and transmitted by an antenna.

In one embodiment, the attenuation circuit 14 can be a PIN diode attenuator.

In addition, in one embodiment of the present invention, the radio frequency transceiver 1 may further comprise a voltage scaling circuit 17, which connects with the temperature sensing circuit 16 in parallel between the reference voltage generating circuit 15 and the attenuation circuit 14. The voltage scaling circuit 17, driven by the reference voltage generating circuit 15, is employed to provide scaled output voltage so as to change the level of the attenuation control signal applied to the attenuation circuit 14. The voltage scaling circuit 17 can be configured to cooperate with the power amplifier circuit 18 to set the signal level of the radio frequency signal from the power amplifier circuit 18 to a desired value.

Figure 2:
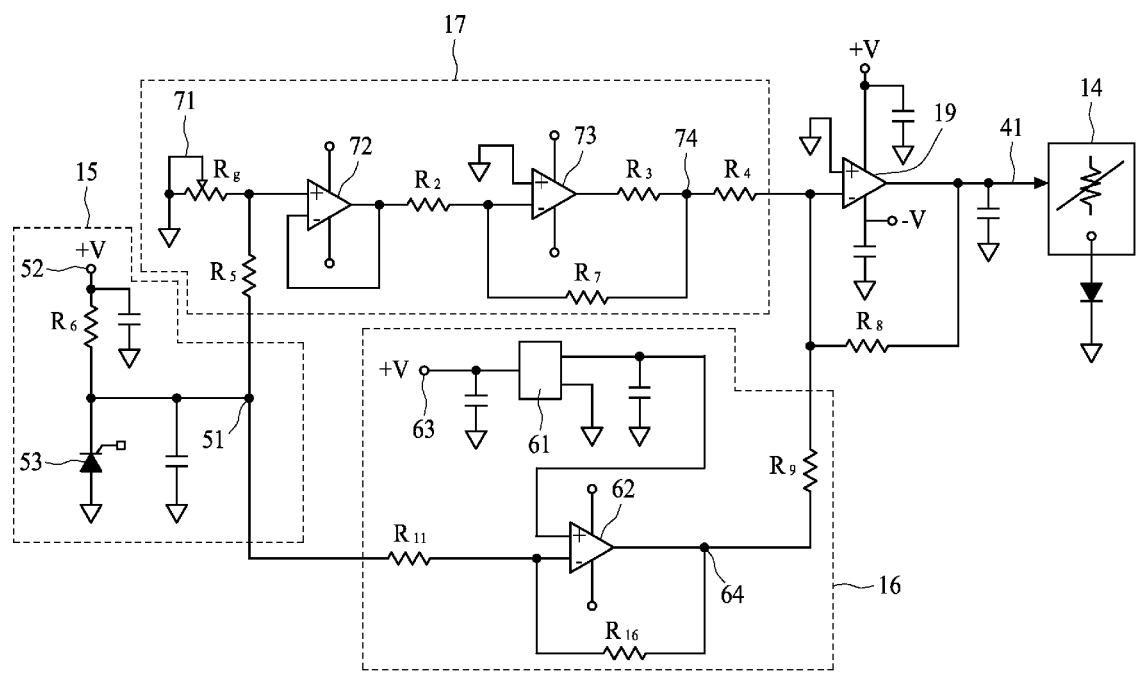
FIG. 2 shows the reference voltage generating circuit, the temperature sensing circuit, and the voltage scaling circuit according to one embodiment of the present invention.

FIG. 2 shows the reference voltage generating circuit 15, the temperature sensing circuit 16, and the voltage scaling circuit 17 according to one embodiment of the present invention. Referring to FIG. 2, the reference voltage generating circuit 15 is configured to provide, at point 51, a reference voltage, which is established by a diode 53 connected in series with a bias resistor $R_6$ to a voltage source 52.

In the present embodiment, the temperature sensing circuit 16 may comprise an amplifier circuit 62 having an output and an inverted input coupled to the output through a resistor $R_{16}$, and a temperature sensor 61 having an input connected with a source of voltage at 63 and an output applying an output voltage $V_{temp}$, responding to ambient temperature, to the non-inverting input of the amplifier circuit 62 for amplification. The inverting input of the amplifier circuit 62 is also connected, through resistor $R_{11}$, with the output of the reference voltage generating circuit 15 at point 51.

In one embodiment of the present invention, the temperature sensing circuit 16 may further include a variable resistor $R_9$ connected to the output of the amplifier circuit 62 for adjusting the rate of change of the attenuation provided by the attenuation circuit 14 with temperature (dB/degree).

In one embodiment, the temperature sensor 61 can be a precision integrated circuit temperature sensor. Examples of such precision integrated circuit temperature sensors are those produced by National Semiconductor such as the LM50 or the like.

Referring to FIG. 2 again, the voltage scaling circuit 17 may comprise a potentiometer $R_g$, a unit gain amplifier circuit 72, and an amplifier circuit 73. The potentiometer $R_g$, configured to provide an adjustable voltage to the unit gain amplifier circuit 72, is connected between ground and the non-inverting input of the unit gain amplifier circuit 72 with the wiper 71 thereof connected to ground. An inverting input of the amplifier circuit 73 is supplied with a voltage produced by the unit gain amplifier circuit 72, the non-inverting input of which connects, through resistor $R_5$, to the output of the reference voltage generating circuit 15. The output of the amplifier circuit 73 connects to one end of the resistor $R_3$. A feedback resistor $R_7$ is coupled between the inverting input of the amplifier circuit 73 and another end of the resistor $R_3$. The output voltage, $V_3$, at point 74 is as follows:

$$V_3 = -\frac{R_7 \times r}{R_2 \times (R_5 + R_p)} V_2 \qquad (1)$$

where
$V_2$ is the voltage at output 51;
$R_p$ is the maximum resistance of resistor $R_g$; and
$r$ is a variable resistance value which is between 0 ohm and $R_g$ ohm.

Referring to FIG. 2, the radio frequency transceiver 1 further includes an amplifier circuit 19 having an output for providing an attenuation control signal to the attenuation circuit 14, a non-inverting input being grounded, and an inverting input coupled with the output of the amplifier circuit 73 through resistors $R_3$, $R_4$ and the output of the amplifier circuit 62 through resistor $R_9$. The value of the attenuation control signal, an output voltage $V_o$ in the present embodiment, at an input 41 is as follows:

$$V_o = -\left(\frac{R_8}{R_9}V_1 + \frac{R_8}{R_4}V_3\right) \qquad (2)$$

where
$V_1$ is the voltage at point 64; and
$V_3$ is determined by Equation (1).

And, the value of voltage $V_1$ can be further determined as follows:

$$V_1 = V_{temp}\left(1 + \frac{R_{16}}{R_{11}}\right) - V_2\frac{R_{16}}{R_{11}}$$

where
$V_{temp}$ is the temperature-related signal provided to the non-inverting input of the amplifier circuit 62.

As shown in Equations (1) and (2), moving the wiper 71 of the potentiometer $R_g$ can scale the voltage $V_3$ up or down, consequently changing the signal level of voltage $V_o$, changing the attenuation level of the attenuation circuit 14, and finally adjusting the signal level of the power amplifier circuit 18.

In summary, one embodiment of the present invention provides a radio frequency transceiver, which includes an attenuation circuit controlled by a temperature sensing circuit. The attenuation circuit provides high attenuation for the signal on the main signal path of the radio frequency transceiver when ambient temperature is low and low attenuation for the signal on the main signal path of the radio frequency transceiver when ambient temperature is high. As such, the gain of the radio frequency transceiver can be held constant during ambient temperature changes.

The above-described embodiments of the present invention are intended to be illustrative only. Numerous alternative embodiments may be devised by persons skilled in the art without departing from the scope of the following claims.

What is claimed is:
1. A radio frequency transceiver, comprising:
a mixer circuit configured to convert an intermediate frequency signal into a radio frequency signal;
a driver amplifier circuit configured to amplify the radio frequency signal from the mixer circuit;
a temperature sensing circuit configured for sensing ambient temperature;
an attenuation circuit connected with the temperature sensing circuit, configured to decreasingly attenuate the radio frequency signal from the driver amplifier circuit as the ambient temperature increases;
a power amplifier circuit for amplifying a radio frequency signal from the attenuation circuit;
a voltage scaling circuit coupled to the attenuation circuit for changing an attenuation level of the attenuation circuit to set the level of a radio frequency signal from the power amplifier circuit to a desired value; and
a feedback resistor and a first amplifier circuit having a first input being grounded, a second input connected with the variable resistor and the voltage scaling circuit, and an output coupled to the attenuation circuit for applying the attenuation control signal, wherein the feedback resistor is coupled between the second input of the first amplifier circuit and the output of the first amplifier circuit,
wherein the voltage scaling circuit comprises a potentiometer and a second amplifier circuit coupled to the potentiometer, wherein the potentiometer is configured to provide an adjustable voltage, and the second amplifier circuit is configured to provide an amplified adjustable voltage to the second input of the second amplifier circuit.
2. The radio frequency transceiver of claim 1, wherein the temperature sensing circuit comprises a temperature sensor configured for outputting a temperature-related signal, a first third amplifier circuit having an output and configured for amplifying the temperature-related signal, and a variable resistor coupled to the output of the first third amplifier circuit of the temperature sensing circuit.

3. The radio frequency transceiver of claim 1, further comprising a band pass filter connected in series between the mixer circuit and the driver amplifier circuit for filtering the radio frequency signal.

4. The radio frequency transceiver of claim 1, wherein the attenuation circuit includes a PIN diode attenuator.

5. A radio frequency transceiver, comprising:
   a mixer circuit configured to convert an intermediate frequency signal into a radio frequency signal;
   a driver amplifier circuit configured to amplify the radio frequency signal from the mixer circuit;
   an attenuation circuit configured to provide variable attenuation for the level of a radio frequency signal from the driver amplifier circuit;
   a power amplifier circuit configured to amplify a radio frequency signal from the attenuation circuit;
   a temperature sensing circuit configured to provide the attenuation circuit with an attenuation control signal varying with changes in ambient temperature such that the level of a radio frequency signal from the power amplifier circuit is held substantially constant during changes in the ambient temperature;
   a voltage scaling circuit coupled to the attenuation circuit for changing an attenuation level of the attenuation circuit to set the level of a radio frequency signal from the power amplifier circuit to a desired value; and
   a feedback resistor and a first amplifier circuit having a first input being grounded, a second input connected with the variable resistor and the voltage scaling circuit, and an output coupled to the attenuation circuit, wherein the feedback resistor is coupled between the second input of the first amplifier circuit and the output of the first amplifier circuit,
   wherein the voltage scaling circuit comprises a potentiometer and a second amplifier circuit coupled to the potentiometer, wherein the potentiometer is configured to provide an adjustable voltage, and the second amplifier circuit is configured to provide an amplified adjustable voltage to the second input of the second amplifier circuit.

6. The radio frequency transceiver of claim 5, wherein the temperature sensing circuit comprises a temperature sensor configured for outputting a temperature-related signal, a third amplifier circuit having an output and configured for amplifying the temperature-related signal, and a variable resistor coupled to the output of the first third amplifier circuit of the temperature sensing circuit.

7. The radio frequency transceiver of claim 5, further comprising a band pass filter connected in series between the mixer circuit and the driver amplifier circuit for filtering the radio frequency signal.

8. The radio frequency transceiver of claim 5, wherein the attenuation circuit includes a PIN diode attenuator.

\* \* \* \* \*